(12) United States Patent
Ohta et al.

(10) Patent No.: US 6,778,020 B2
(45) Date of Patent: Aug. 17, 2004

(54) HIGH-FREQUENCY POWER AMPLIFIER

(75) Inventors: Akira Ohta, Tokyo (JP); Shingo Matsuda, Tokyo (JP); Akira Inoue, Tokyo (JP); Seiki Goto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/379,557

(22) Filed: Mar. 6, 2003

(65) Prior Publication Data

US 2004/0051589 A1 Mar. 18, 2004

(30) Foreign Application Priority Data

Sep. 17, 2002 (JP) ........................................ 2002-269840

(51) Int. Cl.[7] .................................................. H03F 3/04
(52) U.S. Cl. ...................... 330/302; 330/305; 330/306
(58) Field of Search ................................ 330/302, 305, 330/306

(56) References Cited

U.S. PATENT DOCUMENTS

| | | | | |
|---|---|---|---|---|
| 4,527,130 A | * | 7/1985 | Lutteke | .................... 331/36 C |
| 5,105,167 A | * | 4/1992 | Peczalski | .................... 330/295 |
| 5,418,500 A | * | 5/1995 | Igarashi | .................... 331/76 |
| 5,592,122 A | | 1/1997 | Masahiro et al. | |
| 6,388,546 B1 | * | 5/2002 | Kikokawa et al. | .......... 333/218 |
| 2002/0063603 A1 | | 5/2002 | Gotou et al. | |

FOREIGN PATENT DOCUMENTS

| | | |
|---|---|---|
| JP | 8-037433 | 2/1996 |
| JP | 2000-165162 | 6/2000 |
| JP | 2002-164753 | 6/2002 |

OTHER PUBLICATIONS

Goto et al., "Effect of Bias Condition and Input Harmonic Termination on High Efficiency Inverse Class–F Amplifiers", 31st European Microwave Conference, London 2001, pp. 113–116.

Inoue et al., "Analysis of Class–F and Inverse Class–F Amplifiers", 2000 IEEE MTT–S Digest, pp. 775–778.

* cited by examiner

*Primary Examiner*—Patricia Nguyen
(74) *Attorney, Agent, or Firm*—Leydig, Voit & Mayer, Ltd.

(57) ABSTRACT

A resonance circuit of a transmission line and a capacitor is connected to the base circuit of a transistor. The transmission line is shorter than one-quarter wavelength to make the resonant frequency of the resonant circuit higher than the frequency of a second harmonic. As a result, the angle of the reflection coefficient of the second harmonic when an input matching circuit side is viewed from the input terminal of the transistor ranges from 170° to 270° on a polar chart, and phase difference between the fundamental wave of the base current and the second harmonic decreases.

10 Claims, 6 Drawing Sheets

HIGH-FREQUENCY POWER AMPLIFIER

BACKGROUND OF THE INVENTION

1. Field of the Invention

The present invention relates to a semiconductor amplifier such as a transistor for amplification and, more particularly, to a high-efficiency high-frequency power amplifier which is used particular in a mobile communication device and other microwave band communication device.

2. Description of the Background Art

As a conventional high-efficiency high-frequency power amplifier of this type, a class F amplifier is known. This amplifier will be described with reference to a circuit using an HBT (Heterojunction Bipolar Transistor) as a transistor. An output matching circuit is arranged to match an output impedance of the transistor itself with an impedance of a load (generally, an antenna) connected to the transistor. Similarly, an input matching circuit is arranged to match an (input) impedance of the base of the transistor with an impedance of a drive circuit (not shown) connected to the base.

When signals are incident on these matching circuits, the signals are partially reflected by the matching circuits. The ratio of a reflected wave to an incident wave at this time is called a "reflection coefficient". The incident wave and the reflected wave have a difference in phase. This phase difference is called an "angle of reflection coefficient". (The reflection coefficient has an angle because the reflection coefficient itself is a vector.)

When the reflection coefficient on the output side is viewed from the transistor, high operation efficiency can be obtained such if the impedance is a short-circuited for an even-number order (2nd) harmonic wave and electrically open for an odd-number order (3rd) harmonic. Therefore, a "harmonic wave control circuit" (generally, series circuit between a transmission line having a predetermined length and a capacitor) for obtaining high operation efficiency is arranged in the output matching circuit.

A 2nd harmonic included in a collector current is considerably related to the collector efficiency of the transistor. In a phase in which the upper peak of the 2nd harmonic and the upper peak of a fundamental wave are equal to each other, and the ratio of the amplitude of a current to the amplitude of the fundamental wave of the 2nd harmonic ranges from 0.3 to 0.5, the highest efficiency can be obtained. Therefore, it is preferable that the harmonic is relatively high.

Applications in the same field as that of the present invention will be described below.

The "harmonic control circuits" above described are arranged on not only the output side but also the input side, and the impedance is set within a predetermined range with respect to the 2nd harmonic (for example, see Reference 1).

When the "harmonic control circuit" is arranged on the output side, the amplifier is disadvantageous to downsizing. For this reason, the output matching circuit itself is set at a predetermined impedance, so that the "harmonic control circuit" is omitted without deteriorating the operation efficiency (for example, see Reference 2).

An impedance to an even-number order harmonic in the input matching circuit is in an open state, and an impedance to an odd-number order harmonic is in a short-circuit state (for example, see Reference 3).

In all the references, FETs are used as amplification elements, and an operation principle different from that of a bipolar transistor is used to control a gate voltage.

[Reference 1]
Japanese Patent No. 2695395 "High-frequency Power Amplifier" (Claim 1, FIG. 2)

[Reference 2]
Japanese Unexamined Patent Publication No. 2000-165162 "Power Amplifier Circuit" (Claim 1, FIG. 1)

[Reference 3]
Japanese Unexamined Patent Publication No. 2002-164753 "High-frequency Power Amplifier" (Claims 1 and 2, FIG. 1)

Problem to be Solved by the Invention

Although the power amplifier operates as described above, the power amplifier has the following problems. Only the 2nd harmonic current described above which is generated by nonlinearity on the collector side is considered. However, in fact, since the base has some nonlinearity, a 2nd harmonic is also generated in a base current. In the input matching circuit having the above characteristic feature, the phase of the upper peak of a base 2nd harmonic current is delayed by the nonlinearity of a base-emitter parasitic capacitor with reference to the phase of the upper peak of the fundamental wave of the base current.

Since the base current which is multiplied by $\beta$ is equal to the collector current, the phase difference between the fundamental wave of the base current and the 2nd harmonic generates a phase difference between the fundamental wave of the collector current and the 2nd harmonic. As described above, since the upper peaks of the fundamental wave and the 2nd harmonic must be made equal to each other to improve the collector efficiency, the phase difference between the fundamental wave on the base side and the 2nd harmonic causes the efficiency to deteriorate.

SUMMARY OF THE INVENTION

The present invention has been made in consideration of the above circumstances, and has as its object to provide a high-frequency power amplifier in which phase adjustment is also performed to a 2nd harmonic generated on a base side (the phases of the peaks of the 2nd harmonic and a fundamental wave are synchronized to each other) to improve the efficiency of the amplifier.

A high-frequency power amplifier according to the present invention in which an input matching circuit for impedance matching is arranged on an input side of a transistor comprises means for reducing a phase difference between the upper peak of a fundamental wave and the upper peak of a 2nd harmonic, both of these flowing on the input side of the transistor.

According to the first aspect of the present invention, said means sets an angle of a reflection coefficient $\Gamma s2fo$ (standardized by the real-number component of the fundamental wave) of the 2nd harmonic (frequency: 2fo) when the input matching circuit is viewed from the input terminal of the transistor at a value ranging from 170° to 270° on a polar chart.

According to the 2nd aspect of the present invention, said means is a resonant circuit connected to the input side of the transistor and has a resonance frequency which is higher than 2fo.

DETAILED DESCRIPTION OF PREFERRED EMBODIMENTS

Figure 1:
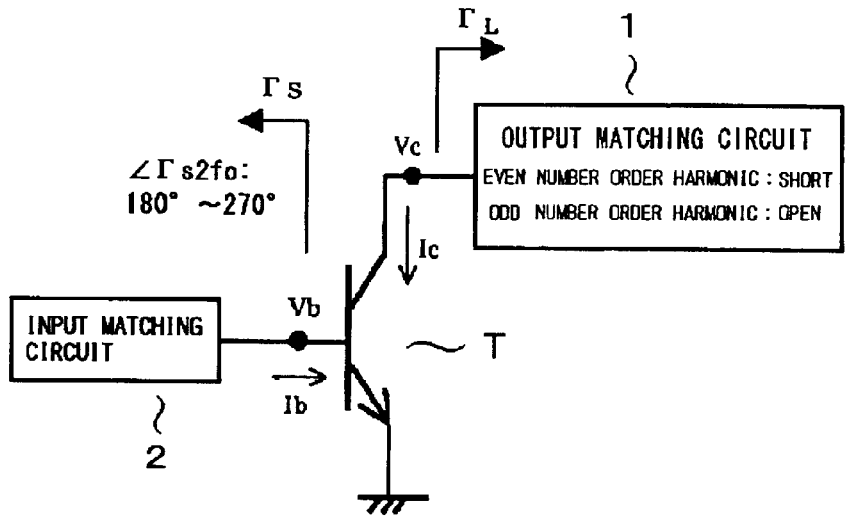
FIG. 1 is a circuit diagram showing the configuration of a high-frequency power amplifier circuit according to the present invention.
Figure 2:
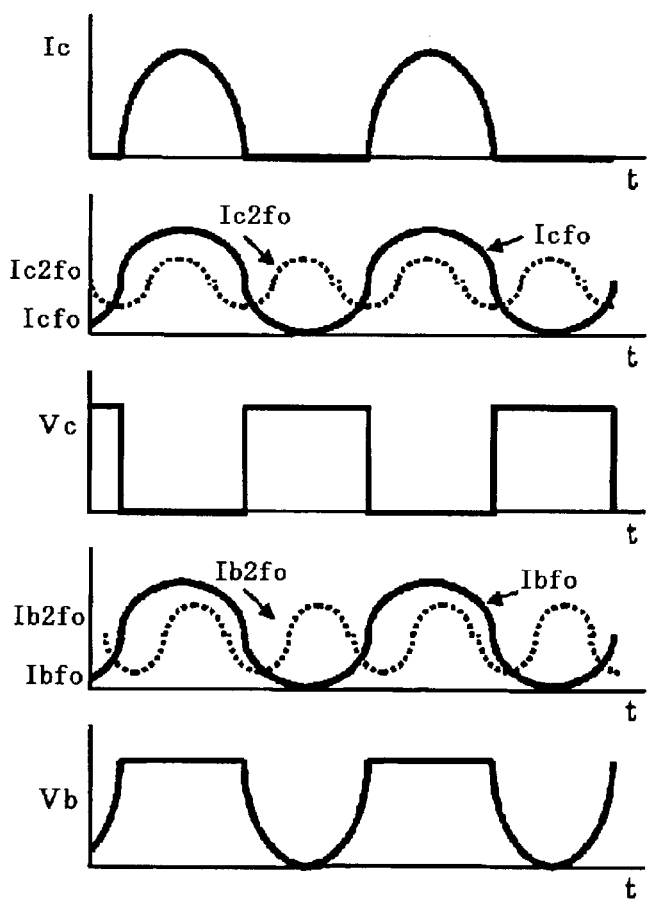
FIG. 2 includes waveform charts showing current/voltage waveforms of the collector and the base of the transistor in the circuit in FIG. 1.

A block diagram of a high-frequency power amplifier according to the present invention is shown in FIG. 1. In an output matching circuit 1 arranged on the output side of a bipolar transistor T, as in a conventional output matching circuit, an impedance is short-circuited by an even-number order harmonic and opened ($\infty$) by an odd-number order harmonic. In an input matching circuit 2 arranged on the base side of the transistor T, an angle $\angle \Gamma s2Fo$ of a reflection coefficient $\Gamma s2fo$ of a 2nd harmonic when the input side is viewed from the transistor T is set at a value ranging from 170° to 270°. As the reflection coefficient $\Gamma s2fo$ obtained at this time, a value standardized by the real-number component of a reflection coefficient $\Gamma sfo$ of a fundamental wave is used. For example, when the impedance of the fundamental wave is (3-j1.5$\Omega$), standardization is performed at 3$\Omega$. The waveforms of a collector current (Ic), a collector voltage (Vc), a base current (Ib), and a base current (Vb) obtained at this time are shown in FIG. 2. The collector voltage has a rectangle wave, and the collector current has a sine wave which is subjected to half-wave rectification. In this case, since no current flows when the collector voltage is any voltage except for 0 V, a collector efficiency is 100%.

As shown in FIG. 2, a 2nd harmonic base current Ib2fo having a phase delayed from the phase of the fundamental wave is adjusted in phase by the input matching circuit 2. For this reason, the phase difference between the upper peak of the fundamental wave Ibfo of the base current and the upper peak of the 2nd harmonic Ib2fo decreases. Since a collector current is generated by amplifying the base current in this state by the transistor, the amplitude of a 2nd harmonic Ic2fo of a collector current Icfo is larger than that of a conventional one, and a ratio of the amplitude of the 2nd harmonic Ic2fo to the amplitude of the collector current Icfo is approximate to 0.3 to 0.5. In addition, the phase of the upper peaks of the fundamental wave and the 2nd harmonic are easily equal to each other. For this reason, it is expected that the collector efficiency becomes high. Note that the base current is obtained such that a parasitic current flowing in a parasitic capacity between the base and the emitter is removed from the base current.

Figure 3:
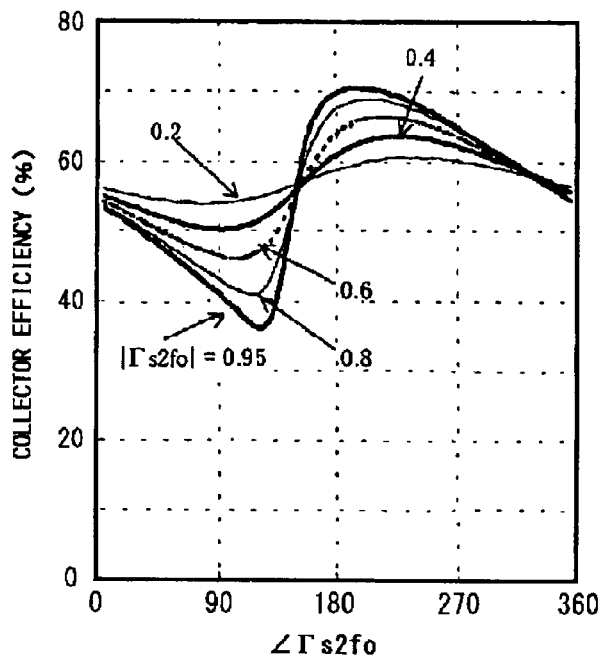
FIG. 3 is a graph showing collector efficiencies (simulation results) in the circuit in FIG. 1.

FIG. 3 shows changes (simulation results) of a collector efficiency when the angle $\angle \Gamma s2Fo$ is changed with respect to absolute values $|\Gamma s2fo|$ of 0.2, 0.4, 0.6, 0.8, and 0.95 of the reflection coefficient $\Gamma s2fo$. As a result, high collector efficiencies were actually obtained when the angle $\angle \Gamma s2Fo$ ranged from 170° to 270°.

In a multistage amplifier, the input matching circuit of the final-stage transistor is connected to or integrated with the output matching circuit of the previous-stage transistor, the absolute value $|\Gamma s2fo|$ of the reflection coefficient $\Gamma s2fo$ may not be sufficiently increased. However, in this embodiment, as is apparent from FIG. 3, even though the absolute value $|\Gamma s2fo|$ is a small value, e.g., 0.2 or 0.4, effect of improving a collector efficiency can be obtained.

Figure 11:
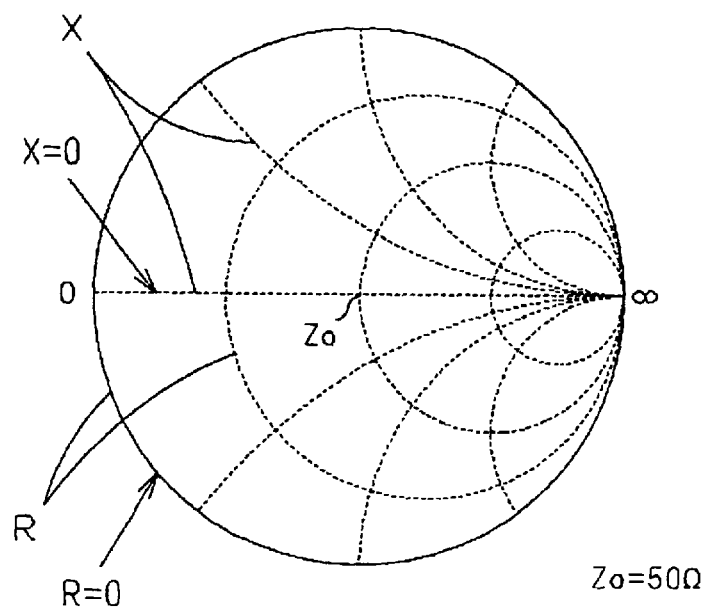
FIG. 11 is a diagram showing a Smith chart showing impedance characteristics of a multistage amplifier.
Figure 12:
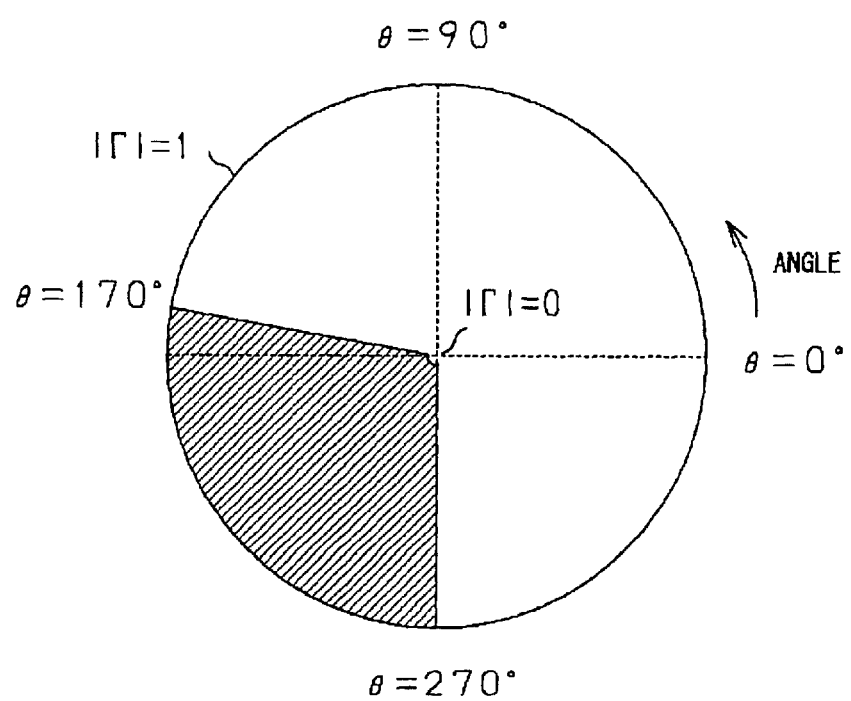
FIG. 12 is a diagram showing a polar chart showing impedance characteristics of a multistage amplifier.

In this case, a Smith chart and a polar chart will be briefly described below. When a constant resistor line R and a constant reactance line X on an impedance plane in the Smith chart in FIG. 11 are expressed as reflection coefficients ($\Gamma$), a polar chart in FIG. 12 is obtained. The reflection coefficient is a vector which is expressed by a dimension $|\Gamma|$ and an angle $\angle \Gamma$.

A hatched area in the polar chart in FIG. 12 represents an angle $\angle \Gamma s2Fo$ (170° to 270°) of a reflection coefficient $\Gamma s2fo$ which is recommended in the present invention. The absolute value $|\Gamma s2fo|$ of the reflection coefficient $\Gamma s2fo$ may be 1 or less (except for 0). When the absolute value $|\Gamma s2fo|$ is limited in a narrow range, a degree of freedom for production is high, and the production can be made easily.

When the angle $\angle \Gamma s2Fo$ is set at about 180° (one cycle in a 2nd harmonic), an incident wave and a reflected wave have equal phases, the 2nd harmonic base current Ib2fo advantageously becomes maximum. However, at the angle, the phases of the peaks of the fundamental wave and the 2nd harmonic are different from each other. As a whole, as is apparent from FIG. 3, the maximum efficiency cannot be obtained.

First Embodiment

Figure 4:
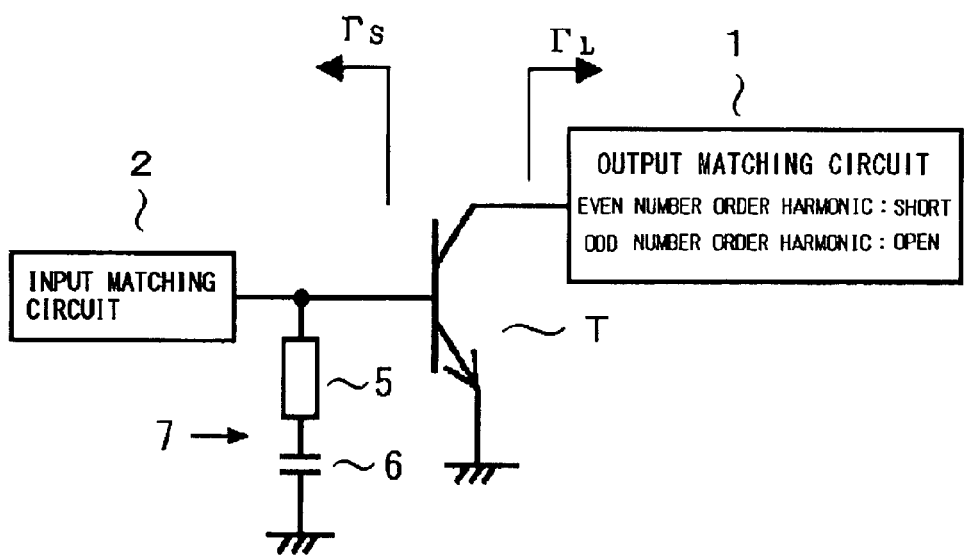
FIG. 4 is a circuit diagram showing the configuration of a high-frequency power amplifier circuit according to the first embodiment of the present invention.

The first embodiment of the present invention is shown in FIG. 4. As shown in FIG. 4, a resonance circuit 7 constituted by connecting a transmission line 5 and a capacitor 6 in series with each other is connected between the base of a transistor T and a GND. In the resonance circuit 7, in order to make an impedance high at the frequency of the fundamental wave, the wavelength of the transmission line 5 is set to ¼ wavelength. However, in this embodiment, the length of the transmission line is set to be shorter than ¼ wavelength (preferably, ⅓ to ¼ of the ¼ wavelength). A value of capacitor 6 is several pF to 10 pF or so (in the case of an operation frequency ranges is from 1 GHz to 5 GHz). The characteristics of an impedance Z between the input and the output of the resonance circuit 7 obtained in this case are shown in FIG. 5.

Figure 5:
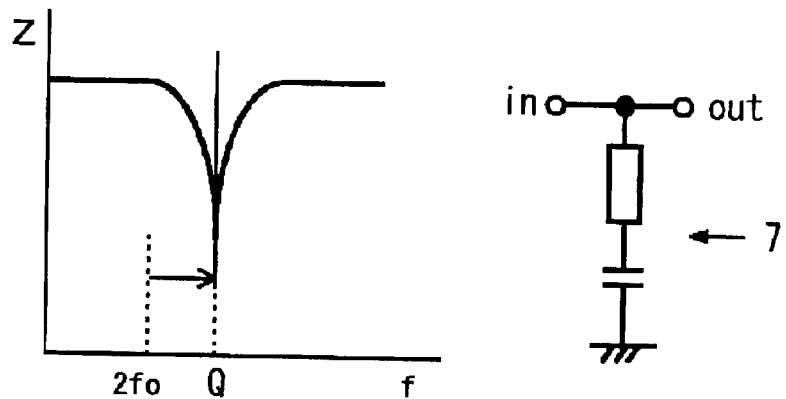
FIG. 5 shows characteristics of a resonant circuit used in the circuit in FIG. 4.

As shown in FIG. 5, a resonant frequency Q of the resonance circuit 7 is larger than a 2nd harmonic frequency 2fo. The resonance circuit 7 is connected to the input side of the transistor T to make it possible to set an angle $\angle \Gamma s2Fo$ of a reflection frequency in a 2nd harmonic base current at 170° to 270°. In place of the transmission line 5 in FIG. 4, an inductor can also be used. Since the line length is short in this embodiment, the resonance circuit 7 can be reduced in size.

Second Embodiment

Figure 6:
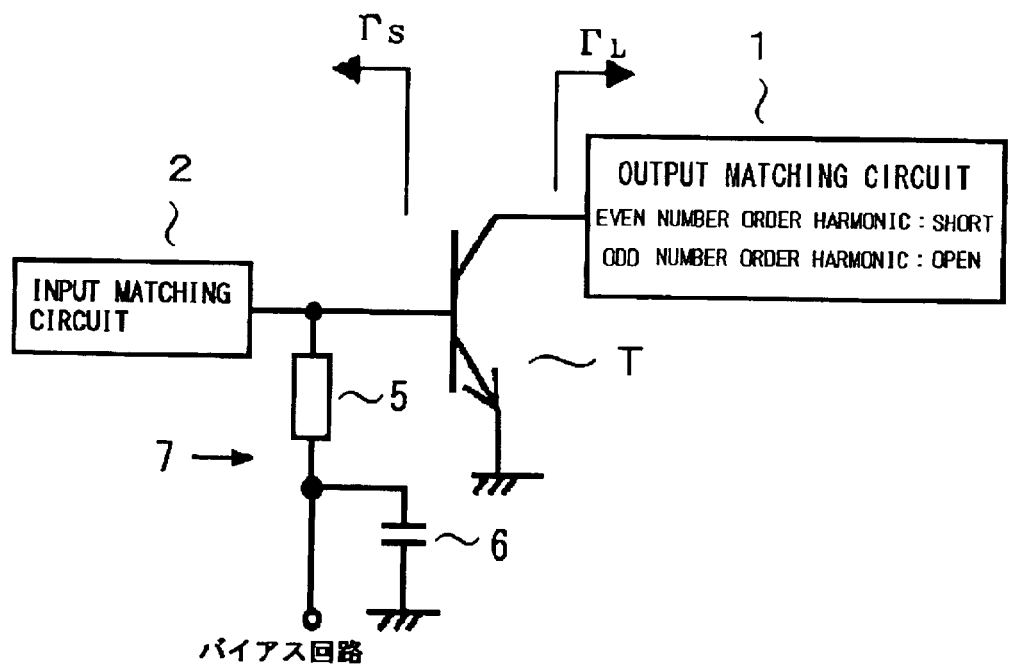
FIG. 6 is a circuit diagram showing the configuration of a high-frequency power amplifier circuit according to the 2nd embodiment of the present invention.

The second embodiment of the present invention is shown in FIG. 6. In this embodiment, in order to make an impedance high at the frequency of the fundamental wave, the line length of the transmission line 5 is set to be ¼ wavelength, and the capacity of the capacitor 6 is set to be large (100 pF or more). The capacitor 6 is completely short-circuited for the operation frequency. When the transmission line 5 is used as described above, the angle ∠Γs2Fo of the reflection coefficient of the 2nd harmonic base current is set to be 170° to 270°.

In the circuit in FIG. 4, a bias circuit for supplying a bias current for the transistor T is actually required. However, even though the bias circuit is connected to the base of the transistor, an element (transmission line of ¼ wavelength) having an impedance which is opened with respect to the fundamental wave is required. In the second embodiment, the transmission line is diverted, so that the resonance circuit 7 can be formed. As a result, the number of parts can be reduced.

Third Embodiment

Figure 7:
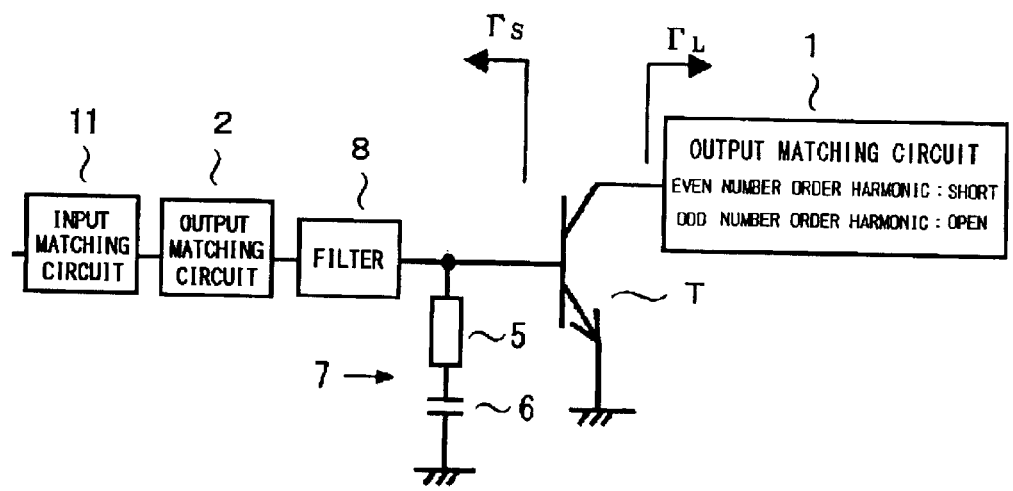
FIG. 7 is a circuit diagram showing the configuration of a high-frequency power amplifier circuit according to the third embodiment of the present invention.

The third embodiment of the present invention is shown in FIG. 7. When the number of stages of the amplifiers are two stages or more, an input matching circuit 2 of a final-stage transistor T is connected to (or integrated with) an output matching circuit 11 of a previous-stage transistor (not shown). In order to improve the efficiency of the previous-stage transistor, the reflection coefficient of a 2nd harmonic when the output side is viewed from the previous-stage transistor must be optimized.

However, an angle ∠Γs2Fo of a reflection coefficient (Γs2fo) of the 2nd harmonic when viewed from the base side of the final-stage transistor is kept at an optimum value ranging from 170° to 270° as described above. On the other hand, it is generally difficult to optimize a reflection coefficient of a 2nd harmonic when the output side is viewed from the previous-stage transistor.

Therefore, as shown in FIG. 7, a filter 8 which is opened with respect to a 2nd harmonic is arranged between the resonance circuit 7 arranged on the base side of the final-stage transistor T and the input matching circuit 2. In this manner, the angle ∠Γs2Fo is kept at an optimum value ranging from 170° to 270° by the resonance circuit 7 on the base side of the final-stage transistor T. On the other hand, the reflection coefficient of the 2nd harmonic obtained when the output side is viewed from the previous-stage transistor can be set by the filter 8 at pleasure.

Figure 8:
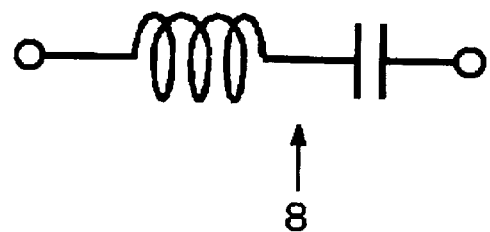
FIG. 8 is a diagram showing the configuration of a filter circuit used in the circuit in FIG. 7.

When this embodiment is used, the collector efficiency of the final-stage transistor T can be improved without degrading the efficiency of the previous-stage transistor. As the configuration of the filter 8, a configuration in which an inductor and a capacitor are connected in series with each other as shown in FIG. 8 can be illustrated. The filter 8 sets a circuit constant such that the s resonant frequency is equal to the frequency of the fundamental wave.

Fourth Embodiment

Figure 9:
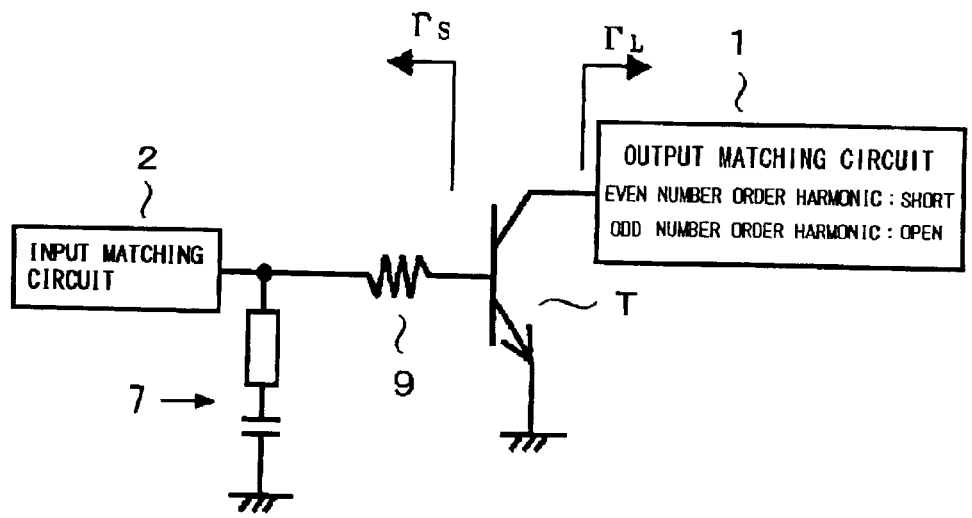
FIG. 9 is a circuit diagram showing the configuration of a high-frequency power amplifier circuit according to the fourth embodiment of the present invention.

The fourth embodiment of the present invention is shown in FIG. 9. An HBT has such characteristics that, when the temperature of the transistor increases, a current increases. For this reason, positive feedback occurs to cause current runaway, and the transistor is broken. As one method of preventing this, a method of inserting a resistor (ballast resistor) in series with the base is known. The ballast resistor must be arranged near the transistor. For this reason, when the resonance circuit 7 is arranged as shown in FIG. 9, a ballast resistor 9 is inserted between the connection point between the input matching circuit 2 and the resonance circuit 7 and the base.

However, in this case, even though the reflection coefficient Γs2fo of the input matching circuit 2 itself including the resonance circuit 7 is set at a value such that the impedance is short-circuit, the reflection coefficient Γs2fo when viewed from the transistor shifts to the open side by a value corresponding to the ballast resistor. When an amount of shift to the open side is large, the 2nd harmonic amplitude on the base side becomes small, and the collector efficiency deteriorate.

For this reason, in the fourth embodiment, in order to prevent the efficiency from deteriorating, the resistance of the ballast resistor 9 is set to be 66% (33Ω when the reflection coefficient Γs2fo is 50Ω) or less of a reflection coefficient Γsfo of the fundamental wave on the source side. In this manner, the absolute value of the reflection coefficient Γs2fo can be set to be 0.2 or more, and the collector efficiency can be suppressed from deteriorating. Note that the value of the ballast resistor 9 is calculated such that the final-stage transistor is considered as one transistor.

The value of the reflection coefficient Γs2fo is obtained when the ballast resistor 9 is not inserted. When the ballast resistor 9 (resistance=Rb) is inserted, a reflection coefficient Γs2fo' obtained when the input matching circuit 2 side is viewed from the ballast resistor 9, the resistance Rb, and the reflection coefficient Γsfo satisfy Γsfo=Rb+Γsfo'.

Fifth Embodiment

Figure 10:
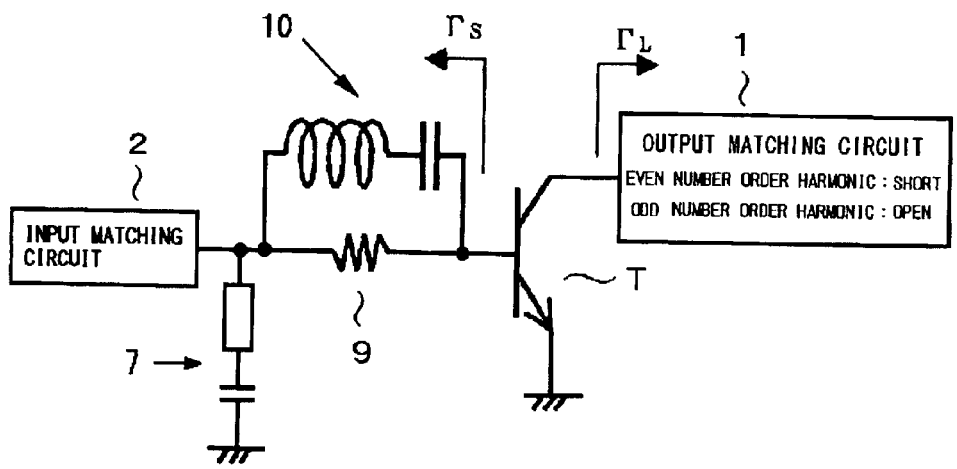
FIG. 10 is a circuit diagram showing the configuration of a high-frequency power amplifier circuit according to the fifth embodiment of the present invention.

The fifth embodiment of the present invention is shown in FIG. 10. As described in the fourth embodiment (FIG. 9), a ballast resistor is arranged to improve the stability. However, the absolute value of a reflection coefficient Γs2fo when viewed from the transistor becomes small. As a result, the collector efficiency deteriorates. In order to avoid this, a resonance circuit 10 which shows zero impedance with respect to a 2nd harmonic is added parallel to a ballast resistor 9. Except for the 2nd harmonic, when viewed from a transistor T, the same result as that obtained when only the ballast resistor 9 is arranged is obtained. However, since the impedance is zero in the resonance circuit 10 with respect to the 2nd harmonic, the absolute value of the reflection coefficient Γs2fo can be increased. According to this embodiment, the stability of an HBT and improvement in the collector efficiency can be simultaneously performed.

In each of the above embodiments, independently of the input matching circuit 2, the resonance circuit 7 or the ballast resistor 9 is arranged. However, these elements may be arranged in the input matching circuit 2.

According to this invention, since the circuit for decreasing the phase difference between the upper peaks of a fundamental wave flowing on the input side of the transistor and the 2nd harmonic is arranged, the phase difference between the upper peaks of the fundamental wave flowing on the output side of the transistor and the 2nd harmonic becomes more small. As a result, the operation efficiency of the transistor can be increased. The circuit can be realized by a simple resonance circuit constituted by a transmission line and a capacitor.

What is claimed is:

1. A high-frequency power amplifier comprising:
   a transistor; and
   an input matching circuit arranged on an input side of said transistor for impedance matching, wherein the input matching circuit reduces phase difference between an upper peak of a fundamental wave flowing on the input side and an upper peak of a second harmonic flowing on the input side.

2. The high-frequency power amplifier according to claim 1, wherein the input matching circuit sets angle of reflection coefficient Γs2fo of the second harmonic, when the input matching circuit is viewed from the input terminal of the transistor, in a range from 170° to 270° on a polar chart.

3. The high-frequency power amplifier according to claim 1, wherein the input matching circuit includes a resonant circuit connected to the input side of the transistor, and the resonant frequency of the resonant circuit is higher than the second harmonic.

4. The high-frequency power amplifier according to claim 3, wherein the resonant circuit includes a transmission line having a length shorter than one-quarter wavelength of the fundamental wave.

5. The high-frequency power amplifier according to claim 3, wherein the resonant circuit includes a transmission line having a length of one-quarter wavelength of the fundamental wave, and the transmission line is connected to the input side of the transistor, and further including a capacitor and a bias supply circuit is connected to a connection point between the transmission line and a capacitor.

6. The high-frequency power amplifier according to claim 1, including a filter which is an open circuit with respect to the second harmonic and connected to an output terminal of the input matching circuit.

7. The high-frequency power amplifier according to claim 6, wherein said filter is a resonant circuit including an inductor and a capacitor connected in series, and the resonant circuit has a resonant frequency at the fundamental wave.

8. The high-frequency power amplifier according to claim 1, including a ballast resistor connected to a base input terminal of the transistor and having a resistance not more than 66% of a reflection coefficient of the fundamental wave on the input side.

9. The high-frequency power amplifier according to claim 8, including a resonant circuit which is short-circuit with respect to the second harmonic and connected in parallel with the ballast resistor.

10. The high-frequency power amplifier according to claim 1, wherein the transistor is a bipolar transistor.

* * * * *